United States Patent
Cain

Patent Number: 5,707,415
Date of Patent: Jan. 13, 1998

[54] METHOD OF VAPORIZING REACTANTS IN A PACKED-BED, COLUMN, FILM EVAPORATOR

[75] Inventor: Michael B. Cain, Corning, N.Y.

[73] Assignee: Corning Incorporated

[21] Appl. No.: 577,985

[22] Filed: Dec. 22, 1995

Related U.S. Application Data

[62] Division of Ser. No. 368,319, Dec. 30, 1994, Pat. No. 5,558,687.

[51] Int. Cl.⁶ ................................. C03B 37/018
[52] U.S. Cl. ................. 65/379; 65/384; 65/413; 65/530; 65/17.4; 118/726; 122/39; 261/DIG. 65; 427/167
[58] Field of Search ............... 65/379, 413, 17.4, 65/395, 17.2, 384, 29.16, 530; 118/726; 122/39, 40; 261/DIG. 65; 427/167

[56] References Cited

U.S. PATENT DOCUMENTS

| | | | |
|---|---|---|---|
| 2,087,156 | 7/1937 | Biggett, 3D | 261/98 |
| 2,849,430 | 8/1958 | Amos et al. | 159/4.01 |
| 2,893,359 | 1/1959 | Magovern | 122/40 |
| 3,191,662 | 6/1965 | Schneider | 159/4.01 |
| 3,298,797 | 1/1967 | Fernandes et al. | 159/48.2 |
| 3,316,064 | 4/1967 | Kuzuoka et al. | 261/153 |
| 3,895,994 | 7/1975 | Saguchi et al. | 159/4.01 |
| 4,104,112 | 8/1978 | Stutz | 159/4.01 |
| 4,166,730 | 9/1979 | Warhul | 55/257.1 |
| 4,185,075 | 1/1980 | Ellis et al. | 261/98 |
| 4,212,663 | 7/1980 | Aslami | 65/144 |
| 4,314,837 | 2/1982 | Blankenship | 65/3.12 |
| 4,387,134 | 6/1983 | Kalpskopf | 428/215 |
| 4,476,065 | 10/1984 | McKey | 261/153 |
| 4,529,427 | 7/1985 | French | 65/3.12 |
| 4,600,654 | 7/1986 | Linder | 428/432 |
| 4,924,636 | 5/1990 | McKown | 165/47 |
| 4,938,789 | 7/1990 | Tsuchiya et al. | 65/144 |
| 5,043,002 | 8/1991 | Dobbins et al. | 65/3.12 |
| 5,078,092 | 1/1992 | Antos et al. | 118/726 |
| 5,090,985 | 2/1992 | Soubeyrand et al. | 65/60.52 |
| 5,349,829 | 9/1994 | Tsimerman | 261/153 |
| 5,356,451 | 10/1994 | Cain et al. | 65/414 |
| 5,470,411 | 11/1995 | Brown | 203/49 |

FOREIGN PATENT DOCUMENTS

| 0303911 | 8/1988 | European Pat. Off. |
| 58-125633 | 7/1983 | Japan |
| 1 559 978 | 1/1980 | United Kingdom |
| WO 94/10228 | 10/1993 | WIPO |

OTHER PUBLICATIONS

U.S. application No. 08/367,047, Cain et al., filed Dec. 30, 1994.

*Primary Examiner*—John Hoffmann
*Attorney, Agent, or Firm*—Edward F. Murphy

[57] ABSTRACT

A vaporizer (film evaporator) (13) for halide-free, silicon-containing liquid reactants used in producing preforms is provided. The vaporizer includes a plurality of packed-bed columns (22) surrounding a central tube (24). A mixture of liquid reactant, e.g., octamethylcyclotetrasiloxane, and gas, e.g., oxygen, is sprayed onto the top surfaces (54) of the columns (22) by a set of spray nozzles (32). The liquid reactant and the gas flow downward together through the columns and are heated by hot oil (28) which flows around the columns' walls (50). The liquid reactant evaporates into the gas until the dew point temperature is reached, at which point all of the liquid reactant will have been converted into vapor. The vapor/gas mixture exits the bottom surfaces 56 of columns (22), where its direction of flow changes from downward to upward. This change in flow direction separates higher molecular weight species (46) from the vapor/gas mixture. The vapor/gas mixture leaves the vaporizer (13) through central tube (24) and is supplied to soot-producing burners (20) where it is used to produce preforms.

10 Claims, 3 Drawing Sheets

5,707,415

METHOD OF VAPORIZING REACTANTS IN A PACKED-BED, COLUMN, FILM EVAPORATOR

This is a division of application Ser. No. 08/368,319, filed Dec. 30, 1994, now U.S. Pat. No. 5,558,687.

FIELD OF THE INVENTION

This invention relates to vaporizers (evaporators) for use in producing preforms which can be used to produce optical or acoustic waveguide fibers either directly or through intermediate production of core cane.

BACKGROUND OF THE INVENTION

Historically, halide-containing raw materials, such as, $SiCl_4$ or mixtures of $SiCl_4$ with various dopants, have been used in the manufacture of preforms by vapor phase deposition techniques, such as, the MCVD (modified chemical vapor deposition), VAD (vapor axial deposition), and OVD (outside vapor deposition) techniques.

In the MCVD technique, the halide-containing raw materials are vaporized and reacted with oxygen to form oxide particles which are deposited on the inside of a fused-silica tube. In the VAD and OVD procedures, vaporized, halide-containing raw materials are hydrolyzed in a burner to produce soot particles which are collected on a rotating starting rod (bait tube) in the case of VAD or a rotating mandrel in the case of OVD. In some OVD systems, the cladding portion of the preform is deposited on a previously-formed core preform, rather than on a mandrel.

Various vaporizers have been developed which can be used in such processes, examples of which can be found in Blankenship, U.S. Pat. No. 4,314,837, French, U.S. Pat. No. 4,529,427 (flash vaporizer), Tsuchiya et al., U.S. Pat. No. 4,938,789, Antos et al., U.S. Pat. No. 5,078,092 (halide-free reactants), and Japanese Patent Publication No. 58-125633 (flash vaporizer). Soubeyrand et al., U.S. Pat. No. 5,090,985, discloses the use of a horizontal thin film evaporator for vaporizing various raw materials employed in the preparation of coated glass articles.

Aslami, U.S. Pat. No. 4,212,663, discloses a vaporization system for a liquid reactant, e.g., $SiCl_4$, in which a heated reactant is deposited on the top of a column containing a porous packing material and carrier gas, e.g., oxygen, is bubbled through a reservoir of the liquid reactant and then up through the column. The Aslami system can include a second, heated column located above the first column which serves to: (1) ensure that the carrier gas is fully saturated, and (2) prevent droplets of the liquid reactant from being entrained in the flowing gas. Significantly, with regard to the present invention, Aslami's reactant and carrier gas do not flow downward together to achieve vaporization and then change direction together to separate out undesirable higher molecular weight species.

U.K. Patent Publication No. 1,559,978 shows another system employing a porous material in the vaporization of liquid reactants, including $SiCl_4$. In this case, the porous material is placed in a vessel containing the liquid reactant, hot silicone oil is flowed over the outside surface of the vessel to heat the reactant, and carrier gas is bubbled through the reactant or introduced into a portion of the porous material located above the upper surface of the reactant. The porous material is said to promote differential evaporation between the liquid reactant and impurities contained therein, whereby a purer gas stream is said to be achieved by using either the early part of the gas stream in the case of an impurity having a vapor pressure lower than that of the reactant or a later part of the stream in the case of an impurity having a vapor pressure higher than that of the reactant.

As with the Aslami patent, this U.K. patent publication does not disclose or suggest the vaporization system of the present invention in which specific flow patterns are used to vaporize a polymerizable material and to separate higher molecular weight species from the vapor stream.

The use of halide-containing raw materials generates substantial quantities of halide-containing by-products, e.g., hydrochloric acid. To avoid environmental pollution, these by-products must be collected, which increases the overall cost of the preform production process. Accordingly, halide-free materials and, in particular, halide-free, silicon-containing materials are desirable starting materials for the production of preforms. See Dobbins et al., U.S. Pat. No. 5,043,002.

As explained in the Dobbins et al. patent, the relevant portions of which are incorporated herein by reference, particularly preferred halide-free, silicon-containing materials for use in producing preforms are polymethylsiloxanes, with the polymethylcyclosiloxanes being particularly preferred, and with octamethylcyclotetrasiloxane (OMCTS) being especially preferred. These same halide-free, silicon-containing raw materials are preferred for use with the present invention.

Cain et al., U.S. Pat. No. 5,356,451, discloses a vaporizer specifically developed for use with halide-free, silicon-containing raw materials, such as OMCTS. In accordance with this technology, a preheater in series with a flat plate vaporizer is used to change the state of the raw material from a liquid to a vapor. Both the preheater and the flat plate vaporizer use electrical resistance wires as their source of heat. In the preheater, the liquid is heated to below its boiling point. In the flat plate vaporizer, additional heat is added to (1) bring the fluid to its boiling temperature and (2) provide the necessary energy to overcome the material's latent heat of vaporization, whereupon the fluid becomes a vapor.

Halide-free, silicon-containing materials are difficult to vaporize due to their sensitivity to cracking and polymerization when subjected to excessive temperatures. Polymerization results in the production of higher molecular weight species which form gums and gels. Additionally, higher molecular weight species may exist in the raw materials as originally manufactured. Such species do not easily vaporize and over time the polymerized materials tend to foul heat transfer surfaces and plug piping systems. Current data suggest that it may not be possible to produce vapor from materials such as OMCTS without incurring some polymerization.

SUMMARY OF THE INVENTION

In view of the foregoing considerations, it is an object of the invention to provide a vaporizer (evaporator) for halide-free, silicon-containing materials which (1) minimizes exposure of the material to high temperatures and (2) collects the gums and gels associated with such a material in a location where they will not foul heat transfer surfaces or plug delivery piping.

To achieve these and other objects, the invention provides a method and apparatus for vaporizing a liquid reactant, such as OMCTS, employing:

(1) a vertically-oriented, packed-bed column (22) having a top surface (54), a bottom surface (56), and an internal operating pressure whose maximum value is $P_{max}$;

(2) introducing means (10, 12, 14, 16, 32) for:
(a) introducing the liquid reactant to the packed-bed column (22) at a first predetermined flow rate and for distributing the liquid reactant over the cross-sectional area of the column, e.g., over the column's top surface (54), and
(b) introducing a gas to the packed-bed column (22) in the region of the column's top surface (54) at a second predetermined flow rate, e.g., introducing the gas above the top surface, at the top surface, or within the top ten to fifteen percent or so of the column, whereby the liquid reactant and the gas both flow concurrently downward through the packed-bed column (see arrow 38);

(3) heating means (18, 28, 30, 34, 36, 60, 62) for heating the packed-bed column (22) to a temperature sufficiently high so that before reaching the bottom surface (56) of the column, the liquid reactant and the gas at their predetermined flow rates are heated to a temperature above the liquid reactant's dew point temperature at $P_{max}$, whereby the liquid reactant is vaporized before reaching the bottom surface (56) and exits from that surface as a mixture of the vaporized reactant and the gas (the vapor/gas mixture);

(4) receiving means (24) for receiving the vapor/gas mixture exiting from the bottom surface (56) of the packed-bed column (22);

(5) separating means (44) between the bottom-surface (56) of the packed-bed column (22) and the receiving means (24) for separating higher molecular weight species (46) of the reactant from the vapor/gas mixture; and (6) removing means (48) for removing higher molecular weight species (46) of the reactant from the separating means (44).

In certain preferred embodiments of the invention, a plurality of packed-bed columns are used and arranged around a central tube which serves as the receiving means for the vapor/gas mixture leaving the separating means. In other preferred embodiments, a gas atomization nozzle is used to apply the liquid reactant and the gas to the upper surface of the packed-bed column.

When practiced in accordance with its preferred embodiments, the vaporizer of the invention has the following advantages over prior vaporizers: (1) the reduction of vaporization temperatureby the addition of gas during the vaporization process, thus reducing the likelihood that polymerization of the reactant will occur during the vaporization process; (2) the reduction in heat transfer surface fouling and delivery piping plugging via the inclusion of separating means for higher molecular weight species of the reactant as part of the vaporizer; (3) the elimination of the need for preheaters located upstream of the vaporizer for the liquid reactant and/or the gas (note that preheaters can be used if desired, but are generally not needed); (4) the elimination of the need to add oxygen to the reactant downstream of the vaporizer (note that oxygen can be added downstream if desired); and (5) the reduction of hot spots which can lead to polymerization of the reactant via the use of fluid-to-fluid heat transfer rather than resistance heaters in the vaporization process (note that resistance heaters can be used if desired).

The foregoing drawings, which are incorporated in and constitute part of the specification, illustrate the preferred embodiments of the invention, and together with the description, serve to explain the principles of the invention. It is to be understood, of course, that both the drawings and the description are explanatory only and are not restrictive of the invention. The drawings are not intended to indicate scale or relative proportions of the elements shown therein.

DESCRIPTION OF THE PREFERRED EMBODIMENTS

Figure 1:
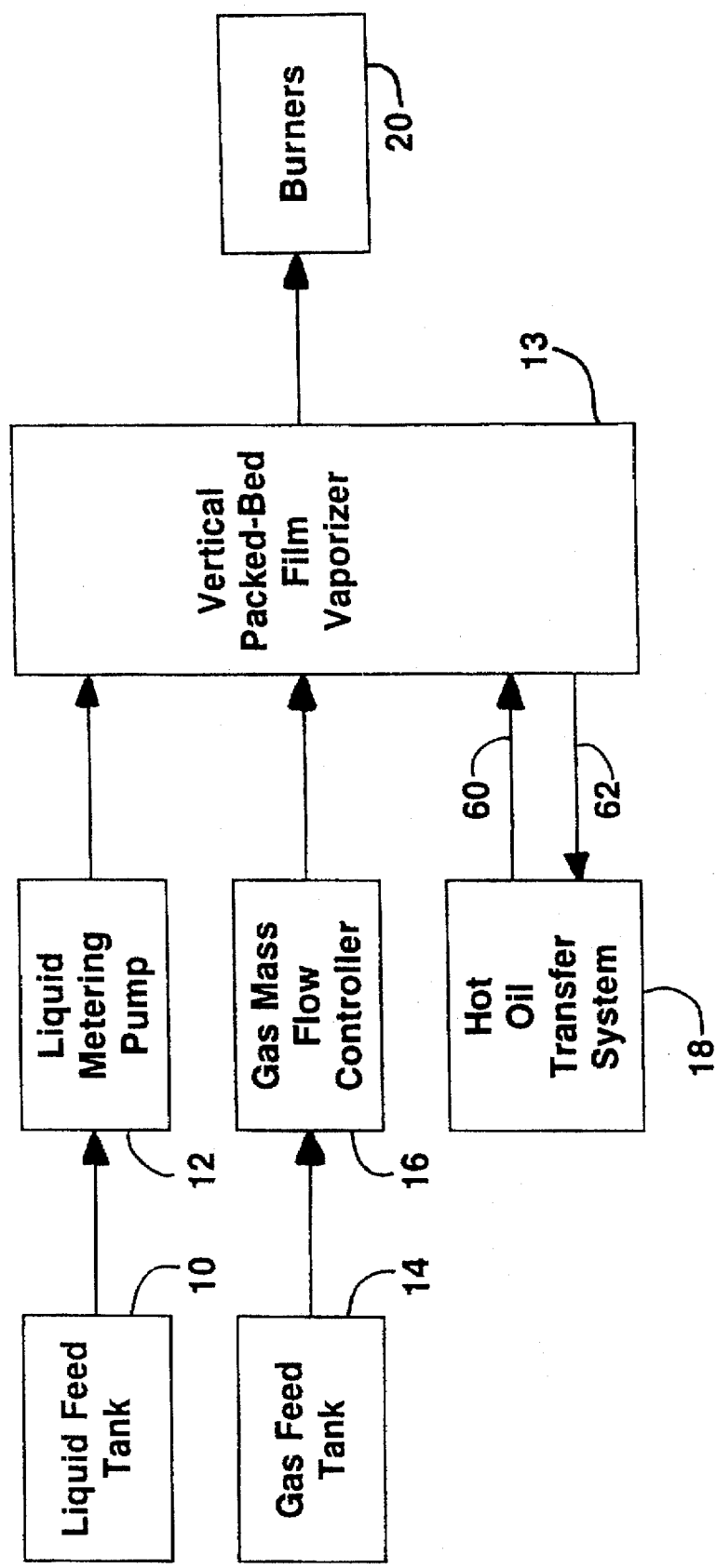
FIG. 1 is a block diagram of a vapor delivery system constructed in accordance with the present invention.

FIG. 1 illustrates an overall system for producing preforms in which a vaporizer constructed in accordance with the present invention can be used. As shown therein, a reactant liquid, such as OMCTS, and a gas, such as oxygen, are supplied to vertical, packed-bed, film vaporizer 13. The vaporizer produces a vapor/gas mixture which is provided to burners 20. The burners oxidize the reactant to produce silicon dioxide soot particles from which the desired preform is formed.

A burner construction for use with OMCTS and similar materials is disclosed in copending, commonly assigned, U.S. patent application Ser. No. 08/367,047, issued as U.S. Pat. No. 5,599,371, entitled "Precision Burners for Oxidizing Halide-free, Silicon-containing Compounds", which is being filed concurrently herewith in the names of Michael B. Cain, Robert B. Desorcie, William J. Kiefer, and Dale R. Powers. In addition to a reactant/oxygen mixture, these burners are also supplied with an innershield gas, e.g., $N_2$, an outershield gas, e.g., $O_2$, and a mixture of $CH_4$ and oxygen to form a pilot flame.

As shown in FIG. 1, reactant liquid is stored in liquid feed tank 10, and is supplied to vaporizer 13 by liquid metering pump 12, which establishes a predetermined flow rate for the reactant, e.g., a flow rate in the range from 50 to 500 grams/minute for OMCTS, with a flow rate in the range from 200 to 400 grams/minute for OMCTS being preferred. The gas used in the vaporizer is stored in gas feed tank 14 and is transferred to the vaporizer at its own predetermined flow rate by gas mass flow controller 16. For example, if the liquid reactant is OMCTS and the gas is oxygen, a preferred flow rate for the gas is in the range from about 0.2 to about 0.4 standard liters per minute (slpm) per gram/minute of OMCTS, with a flow rate of about 0.32 slpm per gram/minute of OMCTS being particularly preferred.

This preferred gas flow rate provides an oxygen/OMCTS vapor mixture which can be directly supplied to burners 20 without the need for the addition of further oxygen to the mixture. For reactants other than OMCTS, preferred oxygen flow rates, which provide ready-to-use oxygen/vapor mixtures, can be readily determined by persons skilled in the art.

Lower oxygen flow rates can be supplied to vaporizer 13 if desired. In such a case, additional oxygen will normally be added to the oxygen/vapor mixture downstream of vaporizer 13. Similarly, gases other than oxygen, e.g., an inert gas, such as nitrogen, can be supplied to vaporizer 13, and oxygen can be added to the inert gas/vapor mixture downstream of vaporizer 13.

Figure 2:
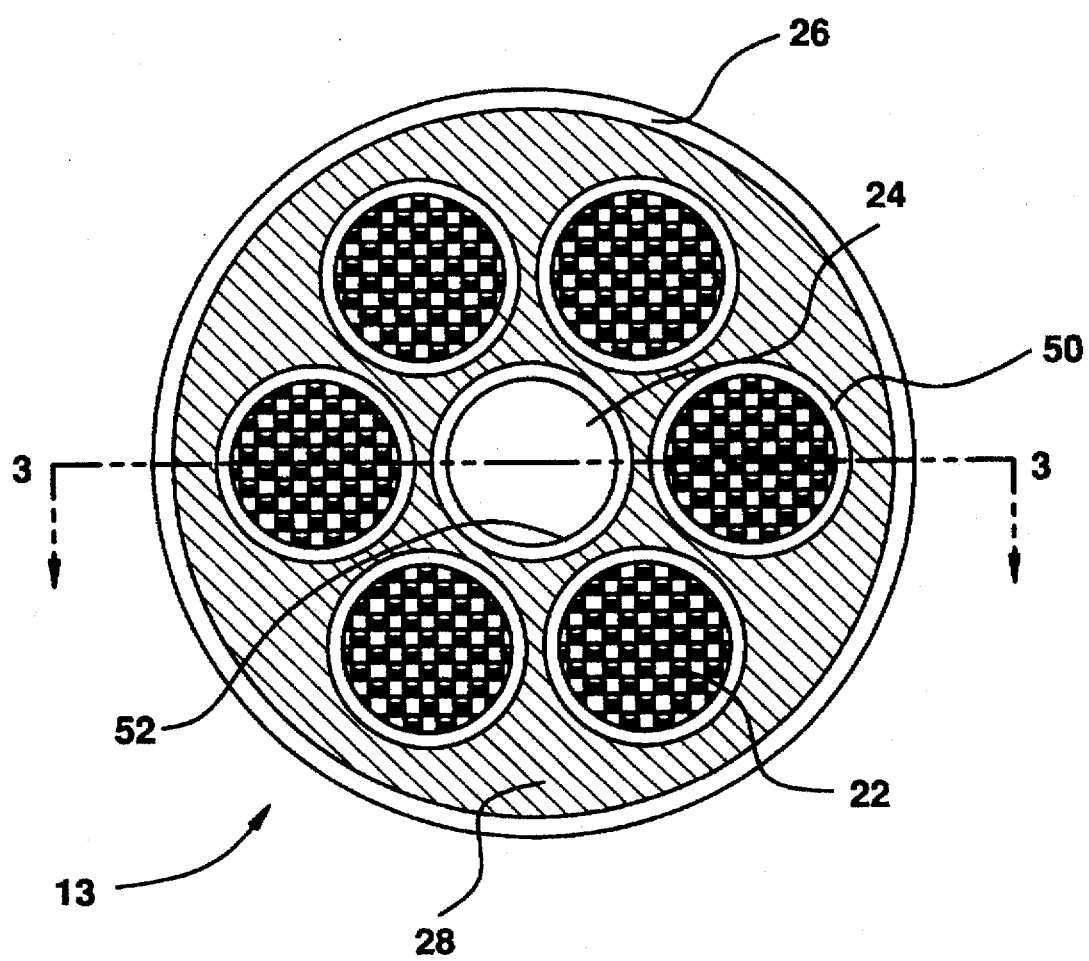
FIG. 2 is a schematic, horizontal cross-sectional view of a vaporizer for use in the system of FIG. 1.
Figure 3:
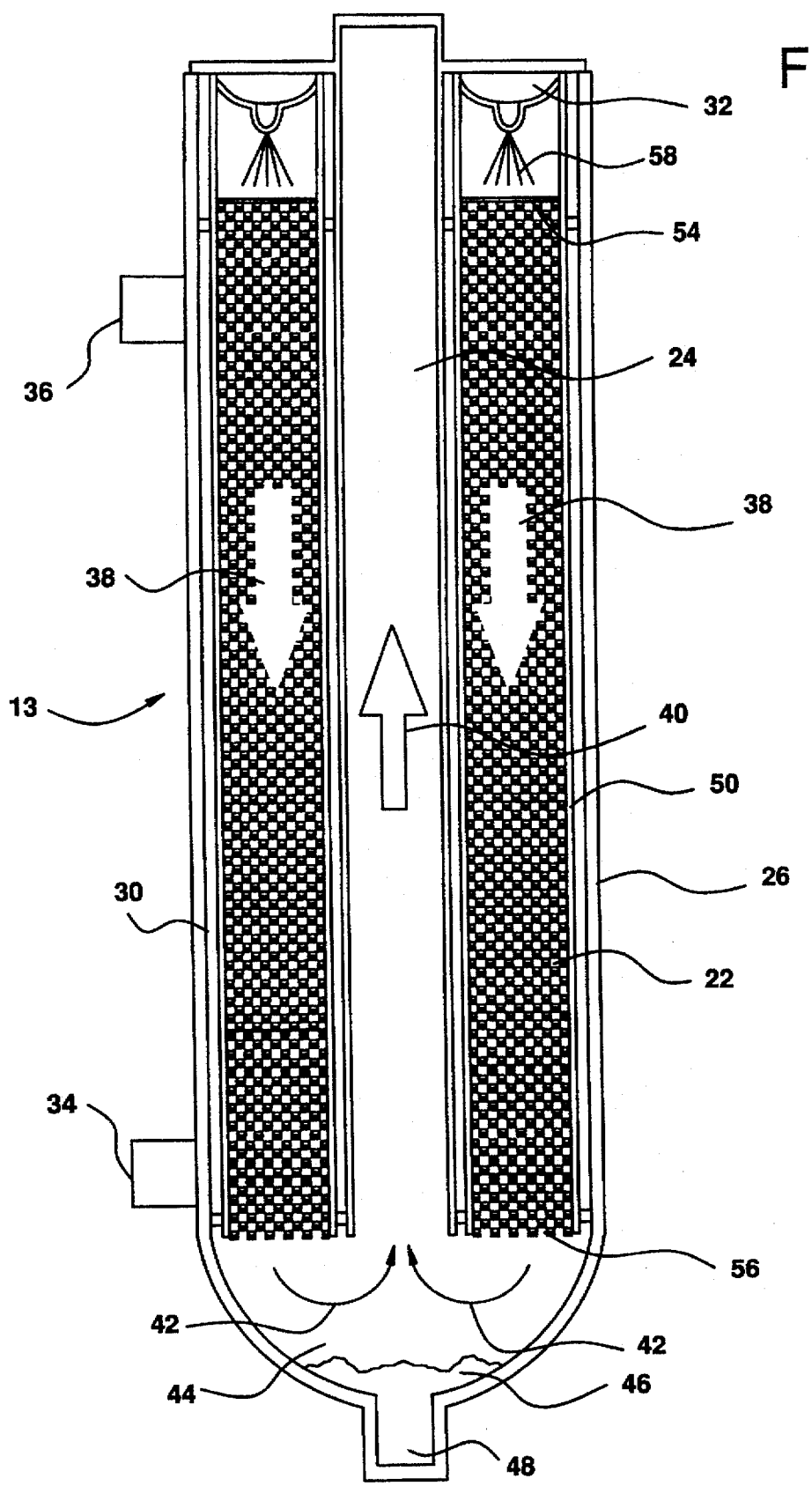
FIG. 3 is a schematic, vertical cross-sectional view along lines 3—3 in FIG. 2 of a vaporizer for use in the system of FIG. 1.

FIGS. 2 and 3 show a preferred construction for vaporizer 13 employing a plurality of packed-bed columns 22 surrounding a central, vertically-oriented, vapor/gas receiving tube 24. The packed-bed columns and central tube 24 are preferably made of stainless steel, have a diameter of about 25 mm, and a length of about 75 cm. Other materials and component dimensions can, of course, be used if desired.

Various packing materials can be used in the packed-bed columns, including beads, fibers, rings, saddles, and the like, which can be composed of glass, metal, ceramics, or other materials that are substantially inert to the reactant. A preferred packing material comprises ceramic elements having a saddle shape and a length of about 6 mm. This packing provides a large surface area to packed volume ratio. The bottom surface 56 of the packed-bed column is equipped with a grate, screen, or the like to retain the packing material within the column.

The liquid phase (OMCTS) and the gas phase ($O_2$) are metered to a series of spray nozzles 32 located at the top of vaporizer 13 using liquid metering pump 12 and gas mass flow controller 16. Other means of supplying the liquid phase and the gas phase to the top of the packed-bed columns, such as a manifold of tubes for each packed-bed column for distributing the liquid phase across the top surface of the column and a single tube for each column for the gas phase, can be used if desired, although the use of spray nozzles is preferred. Distribution of the liquid phase across the top surfaces 54 of the packed-bed columns is important since the liquid phase will tend to flow in a narrow stream through the column if supplied to only a portion of the top surface. Such a narrow stream will reduce the effective surface area available for evaporation of the liquid phase and thus reduce the efficiency of the vaporizer.

Gas atomization nozzles which disperse the liquid phase into a cone of droplets carried by the gas phase (shown schematically at 58 in FIG. 3) are particularly preferred. Such nozzles ensure uniform contact between the liquid and gas phases and uniform wetting of the bed packing. Nozzles of this type normally have separate inlets for the liquid phase and the gas phase. To ensure uniform operation of the plurality of packed-bed columns of FIGS. 2 and 3, the liquid phase inlets of the nozzles are connected to a liquid pressure equalizing manifold (not shown) and the gas inlets are connected to a gas pressure equalizing manifold (not shown). These manifolds, in turn, are connected to liquid metering pump 12 and gas mass flow controller 16, respectively.

In practice, gas atomization nozzles having an orifice size of about 3 mm, a spray cone angle of about 60°, and a pressure drop across the nozzle of about 10 psig have been found to work successfully and are preferred. Other nozzles, of course, can be used in the practice of the invention if desired.

Arrows 38, 40, and 42 in FIG. 3 illustrate the flow pattern through vaporizer 13. Arrows 38 represent the concurrent downward flow of liquid reactant and gas through the packed-bed columns, with the liquid reactant becoming a vapor prior to reaching the bottom surfaces 56 of the columns (see below). Arrow 40 represents the upperward flow of the vapor/gas mixture through central tube 24, and arrows 42 represent the change in the direction of flow of the vapor/gas mixture from downward to upward in phase separator 44. As discussed below, this change in direction serves the important function of separating higher molecular weight species of the reactant (shown schematically in FIG. 3 at 46) from the vapor/gas mixture. In addition to the direction change, further separation and filtration may be achieved by installing an impingement plate and/or glass wool or other filtration material at the inlet of central tube 24. By means of these approaches, the exiting vapor/gas mixture can be essentially completely cleaned of entrained impurities. It should be noted that a filtration material can be used by itself, without a change in direction of the gas/vapor stream, if desired.

Arrows 60 and 62 in FIG. 1 illustrate the flow of hot oil (e.g., silicone oil) from hot oil transfer system 18 to vaporizer 13. Hot oil 28 serves to heat packed-bed columns 22 by flowing around the outside walls 50 of the columns. It also serves to heat the vapor/gas mixture flowing in central tube 24 by heating the outside wall 52 of that tube. Heated fluids other than hot oil, e.g., steam, can be used to heat the packed-bed columns and the central tube, if desired. Also, other heating means, such as electrical heat tape can be used, although the heated fluid approach is preferred since it minimizes the chances for hot spots in the vaporizer which may lead to polymerization of the reactant.

Hot oil 28 enters vaporizer 13 through inlet port 34 and leaves the vaporizer through outlet port 36. While in the vaporizer, the hot oil flows through passages 30 defined by the vaporizer's outer shell 26 and the outside surfaces of the packed-bed columns and the central tube. Baffles (not shown) can be incorporated in passages 30 to ensure a uniform distribution of hot oil around the circumferences of walls 50 and 52.

It should be noted that outer shell 26 extends above nozzles 32 (and above the pressure equalizing manifolds discussed above to which those nozzles are connected) so that the inside of the vaporizer is a closed space. Passing through the outer shell are oil ports 34 and 36, the outlet of central tube 24, and inlet ports (not shown) which provide liquid reactant and gas to the pressure equalizing manifolds.

The mechanism of operation of vaporizer 13 can be viewed as being analogous to what takes place at the surface of a wet-bulb thermometer. That is, liquid reactant coats the surfaces of the packing material and the gas surrounds those surfaces. In the upper regions of the columns, the gas is unsaturated. Accordingly, the packing material functions as the bulb of the wet-bulb thermometer, with liquid reactant absorbing heat from the packing material and evaporating into the surrounding unsaturated gas.

The gas and liquid phases are heated simultaneously as they pass downward through the packed-bed column. As their temperature increases, more liquid vaporizes into the gas phase. The process is controlled by the flow of heat and the diffusion of the vapor through the gas at the interface between the gas and the liquid. The process continues as the mixture flows downward through the columns until the dew point temperature is reached. At the dew point temperature, all of the liquid phase will have been converted into vapor, except for the undesirable higher molecular weight species of the reactant. Thereafter, the vapor/gas mixture continues to increase in temperature as it flows downward towards the column's bottom surface 56.

The dew point temperature will depend upon the mole ratios of the reactant and the gas, the pressure within the packed-bed column, and the specific reactant which is to be vaporized. For example, for the OMCTS and oxygen flow rates set forth above and a maximum pressure ($P_{max}$) within column 22 of about 20 psig, the dew point temperature for OMCTS is in the range of about 145°–150° C.

Based on the calculated dew point temperature for the reactant used and the operating parameters of the system, the temperature of hot oil 28 is set at a value that will ensure that the liquid reactant and the gas will be heated to a temperature above the dew point temperature before they reach the bottom surface 56 of the column. For a packed-bed column having the dimensions discussed above and operating at 20 psig, an oil temperature of 175° C. has been found sufficient to satisfy this requirement for OMCTS as the reactant and for the OMCTS and $O_2$ flow rates given above. Other temperatures, of course, can be used if desired. The amount of heating needed for other reactants, other mole ratios, other $P_{max}$ values, and other vaporizer dimensions can be readily determined by persons skilled in the art from the disclosure herein.

At the exit of the packed columns is phase separator 44 in which higher molecular weight impurities 46 are separated from the vapor/gas mixture and collected for waste discharge. In particular, separator 44 includes port 48 for removing the higher molecular weight species during, for example, periodic maintenance of the system.

As shown in FIG. 3, phase separator 44 comprises a chamber which causes the flow of the vapor/gas mixture to change from downward to upward. This change in direction effectively removes undesirable gels and gums from the vapor/gas stream. Other approaches for cleaning the vapor/gas stream include turning the stream through an angle of less than 180°, e.g., by 90°, and placing an impingement plate and/or filtration material such as glass wool, in the region of the stream which carries the impurities after the turn has been negotiated, i.e., in the outer portions of the stream as seen from the center of the turn. As noted above, the stream exiting the packed columns can be filtered without a change in direction if desired.

After leaving phase separator 44, the clean vapor/gas mixture travels upward through central tube 24. The wall of tube 24 is heated by hot oil 28 and thus the temperature of the vapor/gas mixture is maintained as it passes through the tube and out of the vaporizer.

Without intending to limit it in any manner, the present invention will be more fully described by the following example.

A single tube packed-bed column was constructed using the saddle-shaped ceramic packing material described above. The column was made of stainless steel and had the dimensions described above. Its outer surface was heated to approximately 175° C. using heat tape.

OMCTS and oxygen were supplied to a gas atomization nozzle of the type described above at an inlet pressure of approximately 30 psig. The pressure drop across the nozzle was approximately 10 psig, and the pressure at the exit of the column was approximately one atmosphere.

OMCTS flow rates in the range from 33 to 67 grams/minute were used, with the oxygen flow rate fixed at a ratio of 0.32 slpm/(gm/min) liquid. For example, when the liquid flow rate was set at 33 gm/min, the corresponding gas flow rate was 10.6 slpm. These OMCTS flow rates are equivalent to flow rates in the 200 to 400 grams/minute range for a vaporizer having six packed-bed columns as shown in FIGS. 2 and 3. Both the gas and liquid phases entered the spray nozzle at room temperature (25° C.). Table 1 summarizes the measured vapor temperature at the bottom of the column for the two flow rate extremes.

TABLE 1

| Outlet Temperature of Vaporizer | |
|---|---|
| Liquid Flow Rate | Outlet Vapor Temperature |
| 33 gm/min | 165° C. |
| 67 gm/min | 156° C. |

The dew point temperature for OMCTS under these test conditions is approximately 120°–125° C. As shown by the above table, the packed-bed column was able to raise the temperature of the reactant and the gas to well over this temperature for a wide range of flow rates. Consistent with these temperatures, no liquid reactant was observed exiting the bottom of column.

Although preferred and other embodiments of the invention have been described herein, additional embodiments may be perceived by those skilled in the art without departing from the scope of the invention as defined by the following claims.

What is claimed is:

1. A method of providing reactant vapors to make a silicon dioxide containing preform by decomposing said reactant vapors to form particles, comprising:

(a) providing a reactant in liquid form, at a first predetermined flow rate, said reactant being polymerizable to form a species having a molecular weight higher than a molecular weight of the reactant;

(b) providing a gas at a second predetermined flow rate;

(c) providing a vertically-oriented, packed-bed column having a top surface and a bottom surface;

(d) passing the liquid reactant and the gas through the packed-bed column with the liquid reactant and the gas both flowing downward within the column and with a maximum internal operating pressure within the column during such downward flow being $P_{max}$;

(e) heating the packed-bed column to a temperature so that, before reaching the bottom surface of the column, the liquid reactant and the gas, at their predetermined flow rates, are heated to a temperature above a dew point temperature of the liquid reactant at $P_{max}$, whereby the liquid reactant is vaporized before reaching the bottom surface and exits from the bottom surface as a mixture of the vaporized reactant and the gas (the vapor/gas mixture) is inserted;

(f) separating the higher molecular weight species of the reactant from the vapor/gas mixture; and (g) delivering the vapor/gas mixture to a vapor utilization site to form said preform.

2. The method of claim 1 wherein step (d) further comprises distributing the liquid reactant over a cross-sectional area of the column.

3. The method of claim 2 wherein the distributing step comprises using a gas atomization nozzle.

4. The method of claim 1 wherein in step (e), the heating comprises flowing a heated fluid along at least a portion of the outer surface of the column.

5. The method of claim 1 wherein in step (f) the separating comprises changing the direction of flow of the vapor/gas mixture from downward to upward.

6. The method of claim 1 wherein in step (f) the higher molecular weight species of the reactant are collected in a collection zone and periodically removed from said zone.

7. The method of claim 1 wherein the reactant is a polymethylsiloxane.

8. The method of claim 7 wherein the reactant is octamethylcyclotetrasiloxane.

9. The method of claim 1 wherein the gas is oxygen.

10. The method of claim 1 wherein the preform is used to produce an optical waveguide fiber.

* * * * *